United States Patent [19]

Chang et al.

[11] Patent Number: 4,621,232

[45] Date of Patent: Nov. 4, 1986

[54] INSPECTION OF UNSINTERED SINGLE LAYER OR MULTILAYER CERAMICS USING A BROAD AREA ELECTRICAL CONTACTING STRUCTURE

[75] Inventors: Tai-Hon P. Chang, Chappaqua; Philip J. Coane, Mahopac; Fritz-Jurgen Hohn, Armonk; Walter W. Molzen, Jr., Patterson; Arthur R. Zingher, Elmsford, all of N.Y.

[73] Assignee: International Business Machines Corporation, Armonk, N.Y.

[21] Appl. No.: 610,445

[22] Filed: May 15, 1984

Related U.S. Application Data

[63] Continuation of Ser. No. 267,321, May 26, 1981, abandoned.

[51] Int. Cl.$^4$ ............................................. G01R 31/02
[52] U.S. Cl. .................................... 324/158 R; 324/51
[58] Field of Search ................. 324/51, 158 F, 158 D, 324/158 R, 71.3; 250/310, 311; 156/64

[56] References Cited

U.S. PATENT DOCUMENTS

| 3,016,489 | 1/1962 | Briggs et al. | 324/158 |
| 3,373,353 | 3/1968 | Harris | 324/71.3 |
| 4,169,816 | 10/1979 | Tsien | 252/511 |
| 4,415,851 | 11/1983 | Langner et al. | 324/71.3 |
| 4,417,203 | 11/1983 | Pfeiffer et al. | 324/71.3 |
| 4,443,278 | 4/1984 | Zingher | 156/64 |

FOREIGN PATENT DOCUMENTS 2477758 9/1981 France .

OTHER PUBLICATIONS

Clark et al; "IBM Multichip Multilayer . . . "; IEEE Transactions on Components, Hybrids, and Manufacturing Technology; vol. CHMT-3; No. 1; Mar. 1980; pp. 89–93.
Blodgett, Jr.; "A Multi-Layer . . . "; IEEE Transactions on Components, Hybrids, and Manufacturing Technology; vol. CHMT-3; No. 4; pp. 283–285; Dec. 1980.
Electronics, vol. 53, No. 22, Oct. 1980, New York, L. Lowe, "Elastomers Cushion Prototype Reworks", p. 44.
IBM Technical Disclosure Bulletin, vol. 22, No. 7, Dec. 1979, New York L. A. Gladstein et al., "Low Force Microcircuit Probe", pp. 2824–2826.
Scanning Electron Microscopy/1979/I, H. P. Feuerbaum, "VLSI Testing Using the Electron Probe", pp. 285–296.

Primary Examiner—Ernest F. Karlsen
Attorney, Agent, or Firm—Ronald L. Drumheller; Graham S. Jones, II

[57] ABSTRACT

Apparatus and methods are disclosed for inspecting unsintered single or multiple layer ceramic specimens containing or carrying metal paste patterns of the type commonly used to ultimately form laminated multilayer ceramic (MLC) carriers for large scale integrated (LSI) chips. A relatively large surface area of an unsintered ceramic specimen (large in comparison with the minimum feature size of the paste patterns) is temporarily electrically contacted with a conforming electrode. The conforming electrode makes non-damaging electrical contact to any metallic paste exposed at the contacted area. Electric charge is either collected or delivered by this electrode, depending upon the mode of operation. The electrical continuity of metallic paste paths which contact the electrode and extend through the unfired ceramic specimen to surface positions not contacted by the electrode are tested either by delivering electric charge to the other surface locations and correlating therewith the collection of charge by the electrode, or by delivering charge by the electrode to all paste paths in contact therewith and detecting the presence of charge at the other surface locations. A preferred method either for delivering charge to such other surface locations or for detecting charge at such other surface locations is by using an electron probe beam. Various embodiments for the conforming electrode are described.

3 Claims, 5 Drawing Figures

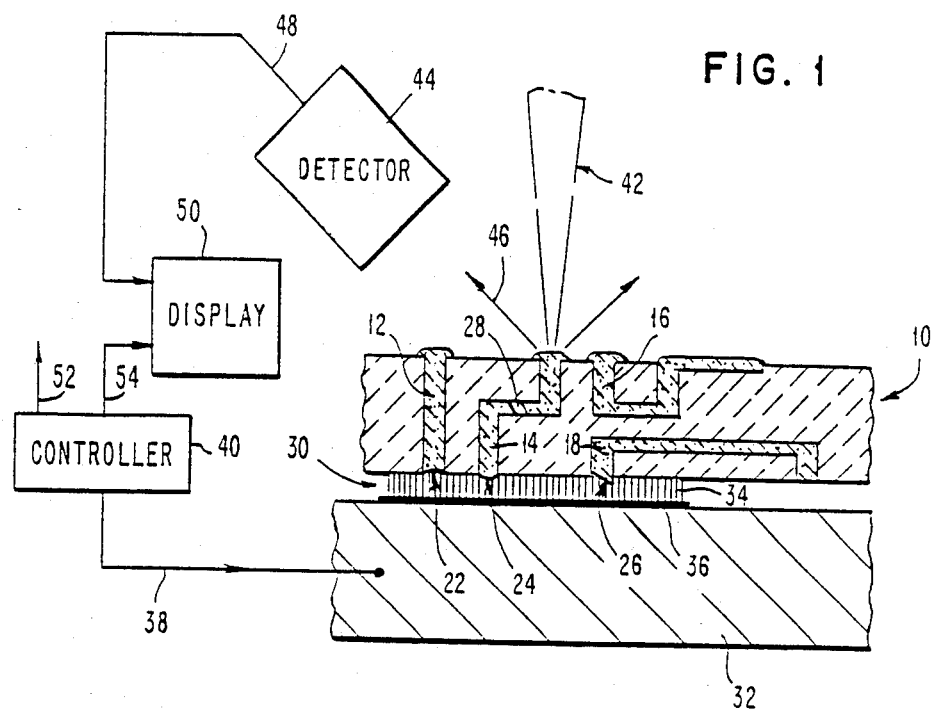
FIG. 1
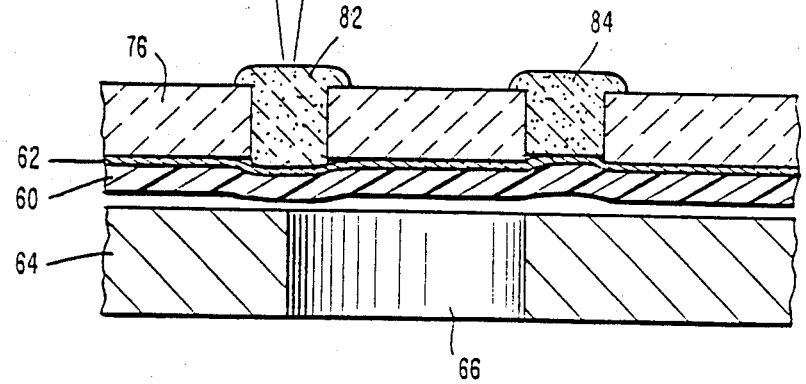
FIG. 2.2

FIG. 2.1

INSPECTION OF UNSINTERED SINGLE LAYER OR MULTILAYER CERAMICS USING A BROAD AREA ELECTRICAL CONTACTING STRUCTURE

This is a continuation of application Ser. No. 06/267,321 filed May 26, 1981, now abandoned.

DESCRIPTION

1. Technical Field

This invention relates to multilayer ceramic (MLC) carriers for electronic circuit chips and more particularly to apparatus and methods for inspecting MLC laminates, sublaminates, and greensheet material prior to sintering.

2. Background Art

Multilayered ceramic circuit modules are employed by the electronic industry today for carrying and interconnecting large scale integrated circuit chips. One type of such modules, generally known as laminated MLC (or simply "MLC") modules or substrates, are formed as follows.

Sheets of flexible unfired (green) ceramic material are cast. The green ceramic sheet is punched with holes (known as vias) in a desired pattern; the punched sheet is then screened with a metallic paste through a mask to form a desired pattern which fills the vias with paste, forms paths of paste on the surface (known as lines) and sometimes forms large areas of paste on the surface (known as pads); unfired screened sheets (known as greensheets) may then be optically inspected; a number of greensheets having generally different screening patterns are then stacked and pressed together, forming what is known as a laminate; the laminate is then fired (also known as sintered) in a furnace to obtain a desired configuration of conducting lines, insulation layers, layer to layer connections, and reference and power planes; the sintered laminate is next plated with metal and electrically tested; pins and chips are attached at this point and chip-in-place testing is done; module wiring may be altered at this point or after the earlier electrical test by laser deletion of surface lines or by adding discrete wires attached by ultrasonic bonding. This process is described in much more complete detail, for example, in B. Clark et al., "IBM Multichip Multilayer Ceramic Modules for LSI Chips—Design for Performance and Density", IEEE Transactions on Components, Hybrids, and Manufacturing Technology, Vol. CHMT-3, No. 1, pages 89–93 (Mar. 1980) and in A. Blodgett, Jr., "A Multilayer Ceramic, Multi-Chip Module", IEEE Transactions on Components, Hybrids, and Manufacturing Technology, Vol. CHMT-3, No. 4, pages 283–285 (Dec. 1980), both of which are hereby incorporated by reference.

Given these processing steps, the first electrical test occurs after sintering and plating, at a point where significant manufacturing costs have already occurred. Electrical testing after sintering and prior to plating, while preferred from a cost basis, is not known in the art presumably because of the nature of the surface which results from firing metallic paste and certain deficiencies in existing testing technology. Optical inspection of greensheets can identify some defects in greensheets but internal voids in the paste, for example, cannot be detected. Obviously, optical testing of laminates could not detect internal defects. Electrical testing before sintering is not known in the art, heretofore, because it was assumed that metallic paste is an insulator in the unfired state.

One of us discovered surprisingly that unfired metallic paste of the type used to form MLC modules has electrical properties such that it can be electrically tested within a matrix of unfired ceramic material of the type used to form MLC modules. Heretofore, it was assumed that electrical properties of these materials were not suitable for a practical electrical test until after sintering. The ability to electrically inspect green MLC ceramic material made the formation of and the electrical testing of sublaminates feasible and desirable. These discoveries are described and claimed in detail in a copending and concurrently filed patent application by A. R. Zingher entitled, "Inspection of Multilayer Ceramic Circuit Modules By Electrical Inspection of Unfired Green Sheets", Ser. No. 267,272, now U.S. Pat. No. 4,443,278, which is hereby totally incorporated by reference.

A problem encountered in electrically testing unsintered MLC laminates, sublaminates and greensheets is that the unfired materials are very soft and easily damaged. Conventional methods for electrically contacting electronic circuits or modules resulted too often in physical damage to the soft unfired specimen, so that as a result of the electrical test, many specimens became worthless for further use in the manufacturing process. Accordingly, non-contacting methods were explored and resulted in further copending and commonly assigned patent applications which have also been filed concurrently herewith, namely "System for Contactless Testing of Multi-Layer Ceramics" by G. O. Langner and H. C. Pfeiffer, Ser. No. 267,118, now U.S. Pat. No. 4,415,851, and "System for Contactless Electrical Property Testing of Multi-Layer Ceramics" by H. C. Pfeiffer, R. A. Simpson, and W. Stickel, Ser. No. 267,119, now U.S. Pat. No. 4,417,203, both of which are hereby also fully incorporated by reference.

DISCLOSURE OF INVENTION

Apparatus and methods are disclosed for inspecting unsintered single or multiple layer ceramic specimens containing or carrying metal paste patterns of the type commonly used to ultimately form laminated multilayer ceramic (MLC) carriers for large scale integrated (LSI) chips. A relatively large surface area of an unsintered ceramic specimen (large in comparison with the minimum feature size of the paste patterns) is temporarily electrically contacted with a conforming electrode. The conforming electrode makes non-damaging electrical contact to any metallic paste exposed at the contacted area. Electric charge is either collected or delivered by this electrode, depending upon the mode of operation. The electrical continuity of metallic paste paths which contact the electrode and extend through the unfired ceramic specimen to surface positions not contacted by the electrode are tested either by delivering electric charge to the other surface locations and correlating therewith the collection of charge by the electrode, or by delivering charge by the electrode to all paste paths in contact therewith and detecting the presence of charge at the other surface locations. A preferred method either for delivering charge to such other surface locations or for detecting charge at such other surface locations is by using an electron probe beam. Various embodiments for the conforming electrode are described.

BRIEF DESCRIPTION OF THE DRAWINGS

FIG. 1 schematically shows a system for electrically testing unsintered ceramic samples containing paths of metallic paste using one kind of conformable electrode and illustrates one mode of operation.

DESCRIPTION OF THE PREFERRED EMBODIMENTS

Figure 2:
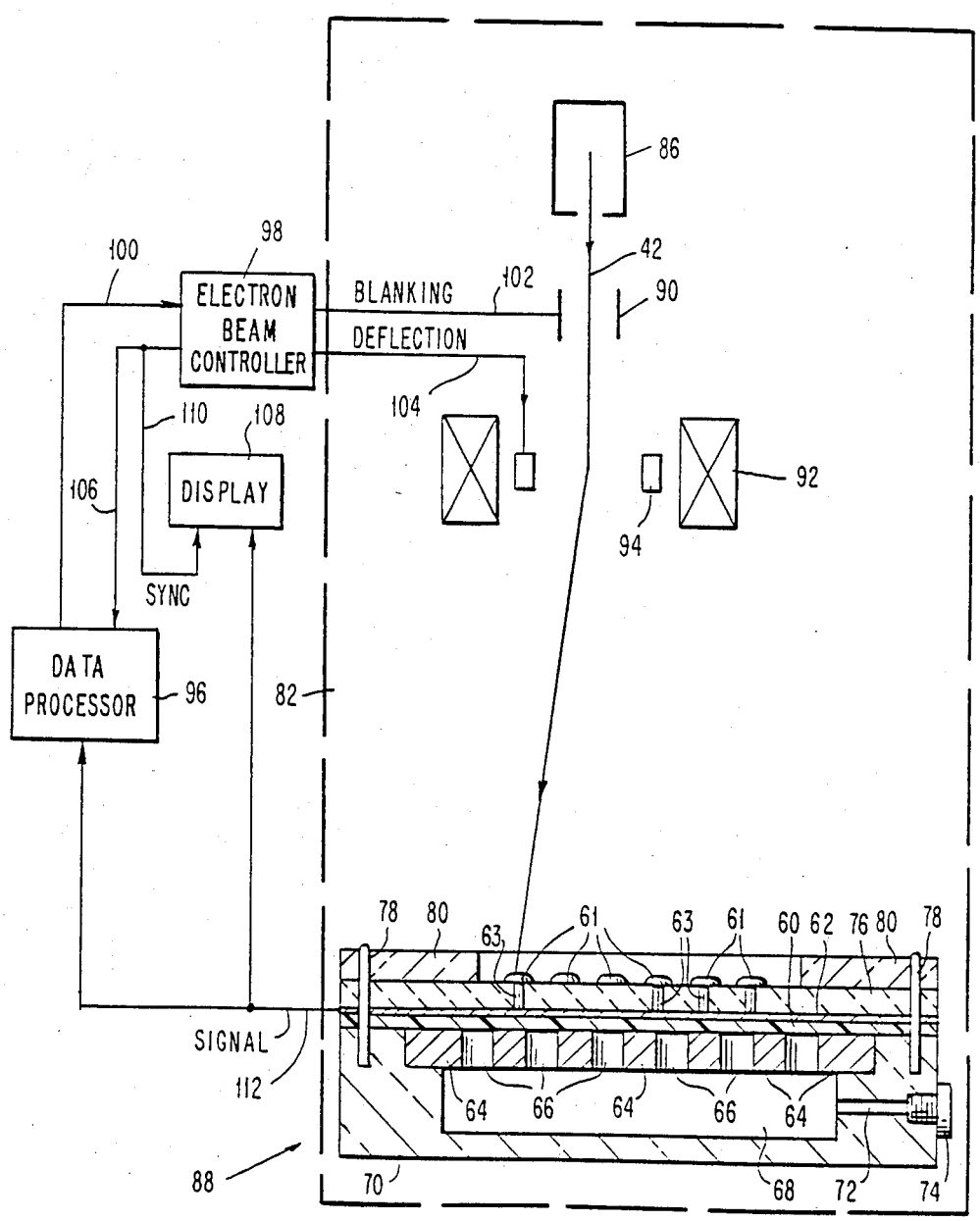
FIGS. 2.1 and 2.2 schematically show another system for electrically testing unsintered ceramic samples containing paths of metallic paste using another kind of conformable electrode and illustrates another mode of operation.

Referring now to FIG. 1, the typical structure of an unsintered multilayer ceramic laminate or sublaminate specimen is illustrated, along with apparatus for electrically testing the specimen. The multilayer ceramic specimen 10 typically has pathways 12, 14, 16, 18 within a laminated green (unfired) ceramic body 20. Vertical paths or portions of paths through the body 20 have been formed when vias in individual greensheets align with each other while horizontal paths or portions of paths are formed from lines in greensheets. The pathways 12, 14, 16, 18 have ideally been filled completely with a metallic paste material during fabrication which upon sintering will form electrically conducting paths. The metallic paste typically does not form a perfectly flush surface with the surface of the ceramic body 20. Thus, some paste is typically lower than the ceramic body surface as illustrated at 22, while some other paste is higher than the ceramic body surface as illustrated at 24. Sometimes paste is partly below and partly above the ceramic body surface as shown at 26. Due to the screening process for applying metallic paste to greensheets, the paste is typically higher than the ceramic surface on one side (shown here as the top side) and level with the ceramic surface on the other side (shown here as the bottom side). Pathways typically lead from one major surface to the other (pathways 12, 14) and from one major surface into the ceramic body and back to the same major surface (pathways 16, 18).

A typical internal defect which occurs in a multilayer ceramic specimen is a void such as shown at 28 in path 24. A void which is sufficiently large results after firing in an electrical path which is broken. Another internal typical defect is when a path becomes inadvertently connected to another path. This results in a short between two electrical paths after firing. In addition to internal defects, a surface defect may exist in a single or multilayer ceramic specimen which will become an internal defect as soon as the specimen is laminated with other specimens to form a specimen having a larger number of layers. An example of such a surface defect is a via which has been so incompletely filled that the unfilled space will become an internal void upon lamination with other specimens. A via may also become so overfilled that the excess paste may connect two paths not intended to become connected when the specimen is laminated with other specimens. An inadvertent break in a surface line of paste is another example of a possible surface defect. It is desirable to be able to detect these defects and in accordance with this invention such defects may be detected, at least in part, by electrically testing the conductivity of paste paths through use of at least one conformable broad area electrical contact which does not damage unfired single or multilayer ceramic specimens.

The conformable electrode 30 illustrated in FIG. 1 comprises a rigid, preferably electrically conductive plate 32 supporting an array of conductive fibers 34 oriented substantially parallel to each other and in side-to-side contact with each other. The conductive fibers 34 are held in this orientation by glue or paste 36, which preferably also is conductive. The glue 36 may or may not also bond the fiber array to plate 32. Electrical connection is made to the conducted fibers 34 of electrode 30 via lead 38, preferably by electrical contact to plate 32. Direct electrical contact by lead 38 with the fiber array is a possible alternative as well as direct electrical contact with the glue 36, assuming the glue is electrically conductive. Obviously, an indirect electrical connection to the fiber array via the plate 32 requires that plate 32 be conductive and preferably also glue 36. Electrically conductive glues are readily available commercially.

Fibers 34 are sufficiently flexible that they bend individually to conform the top surface of the array to an irregular contacting surface such as is typical of an unfired single or multilayer ceramic specimen. Depending upon the weight of the specimen in relation to the resiliency of the fiber array, conforming contact may be caused automatically by virtue of gravitational force acting upon the specimen. Additional force may also be applied in any convenient manner, if necessary, to make conforming contact.

An experimental electrode structure 30 as illustrated in FIG. 1 was actually constructed as follows. Commercially available carbon fiber cloth was cut into about 500 virtually identical narrow strips (about 9 mm × 60 mm) oriented such that fibers lie transverse to each strip. The carbon cloth strips were then stacked in side-to-side relationship in a frame, squeezed together into close contact and glued together at one side of the array using silver paste. There were about 10 cloth strips per millimeter in the glued structure. Longitudinal carbon fibers in the cloth strips were then removed using tweezers and the unglued side was made more planar with an ordinary electric shaver. The resulting structure had a conforming surface which closely resembles velvet cloth. Other methods are obviously possible for forming a velvet-like surface out of carbon fibers or the like. While carbon fibers are preferred, any fine flexible electrically conductive fiber could be used instead.

The constructed velvet-like electrode was positioned on a rigid metallic plate and an unfired multilayer ceramic specimen placed on top. The weight of the specimen was sufficient to cause the electrode to make common electrical contact with all of the exposed vias in the contacted bottom surface area and no damage occurred to the unfired metallic paste or ceramic.

FIG. 1 illustrates one system for electrically testing unsintered ceramic specimens using a broad area conforming electrical contact. Controller 40 applies an electrical signal to electrode 30 via lead 38. Either the voltage level of lead 38 may be controlled, or the current flowing to or from electrode 30 may be controlled, or the charge delivered or taken from electrode 30 may be controlled. In any event, electrical charge will flow through the paste filled pathways in the ceramic body 20 and tend to change the voltage level of the paste at the other end of the connected pathways. In the illustration, the ends of pathways 12 and 18 remote from electrode 30 would tend to experience a change in voltage level. The remote end of pathway 14 would not tend to experience the same change because charge flow through the pathway is interrupted (or at least impeded) by the void 28. The voltage level at the remote ends of pathways 12, 14, and 16 are then detected using a scanning electron probe beam 42.

Probe beam 42 is a conventional SEM type probe beam which may be scanned about in raster scan mode or vector scan mode as is well understood in the art. Details of the construction of an SEM type electron probe beam are well known and form no part of this invention.

The voltage level of a surface subjected to an electron beam affects the energy of secondary electrons emitted from the surface. This phenomenon is described in great detail, for example, in the cited copending application entitled, "System for Contactless Testing of Multi-Layer Ceramics". A suitable detector 44 descriminates between secondary electrons which have energy corresponding to the changed voltage state such as can be expected at the remote end of pathway 12 and secondary electrons 46 which have energy corresponding to the unchanged voltage expected at the remote end of pathway 14 to produce a signal 48. Secondary electron detectors of this kind are readily available and understood by those of ordinary skill in SEM art. Details of this sensing system do not form part of this invention.

Signal 48 is displayed on device 50. Controller 40 controls the position of the electron probe beam via line 52 and synchronizes the display therewith via line 54. Display 50 preferably is a two dimensional pictorial display device such as a CRT. However, other displays could be used instead. Signal 48 also could be sent to a data processor as illustrated in FIG. 2.1 in addition to or in place of the display.

FIG. 2.1 illustrates a different testing system using a different conformable electrode. A thin flexible sheet 60 of mylar or other similar plastic carries a deposited conductive film 62 on the top side thereof and rests, in turn, on top of a flat plate 64 having perforations 66. The plate is positioned above a fixed volume enclosed cavity 68 defined by a fixture body 70. The plate 64 and body 70 completely enclose cavity 68 except for perforations 66. The mylar material 60 completely covers all perforations 66 and is sealed to the top periphery of the fixture body 70 to provide a vacuum tight seal. The cavity 68 is evacuated to a predetermined partial atmospheric pressure via port 72 and sealed off by seal 74.

A greensheet 76 is placed over the mylar film 60 in contact with the conductive film 62 and accurately positioned by alignment pins 78 which extend from the fixture body 70 through punched holes in the greensheet. A frame 80 acts as a weight to hold the periphery of the greensheet against the flexible film.

When the assembly is placed in an electron beam system vacuum chamber 82 and the chamber is evacuated, the partial atmospheric pressure in the cavity 68 causes the flexible sheet 60 to uniformly press against the underside of greensheet 76 and conform to the irregularities of the greensheet surface. The flexible sheet is held in conforming contact with the greensheet by a higher gas pressure inside cavity 68 than the gas pressure in the vacuum chamber surrounding the greensheet during electrical test. The conductive film 62 on the flexible sheet 60 thus electrically contacts any metallic paste exposed at the underside of the greensheet in a non-damaging manner.

FIG. 2.2 is an enlarged view of a greensheet 76 and the flexible film 60 and plate 64 illustrated in FIG. 2.1. The greensheet 76 has a via 82 where the paste was pushed too far through the via and protrudes from the bottom surface of the greensheet and another via 84 where the paste was not pushed far enough into the via and fails to fully fill the via. These are not actually defective vias because during lamination greensheets are pressed together. Furthermore the vias and lines of a greensheet under this greensheet in a stack probably will have protruding paste on the top side, as is typical, and as is shown on the top side of these vias. As illustrated, the flexible sheet 60 conforms to small irregularities such as this so that the conductive film 62 contacts both of these vias.

Returning now to FIG. 2.1, an electron beam source 86 generates electron beam 42 which may be blanked or turned off by blanking means 90. Electron beam 42 is focussed by one or more focussing coils 92 and may be deflected in two dimensions by coils 94. Data processor 96 may contain, for example, a representation of a correct electrical test pattern for greensheet 76. Signals from processor 96 to electron beam controller 98 via line 100 direct the controller to scan the greensheet in a desired pattern, which is done by controller 98 via blanking signals and deflection signals on lines 102 and 104 respectively. The processor 96 may be generating synchronization signals for controller 98, but in the illustrated system, controller 98 generates the synchronization signals and supplys them to the processor 96 via line 106. Synchronization signals (or x-y position signals where vector scan mode is used) are also supplied to a display 108 via line 110. Line 112 is electrically in contact with the conductive film 62 and supplies a signal from the conformable electrode 88 to display 108 and processor 96.

When an electron beam of suitable energy strikes a surface such as the top of a via, the surface becomes electrically charged. Vias which do not have substantial voids (and all conductive paste pathways in general) conduct some charge to the remote end of the via (or pathway). If the remote end is in electrical contact with a conformable electrode, the charge is collected by the conformable electrode as a signal. Obviously, a signal could be in the form of a charge signal, a current signal (actually a charge flow rate) or a voltage signal (actually a charge accumulation). Herein when it is said that charge is applied or detected it is understood that such can (and probably will) be done by applying or detecting voltage or current instead. The term charge also equally applys to positive as well as negative charge or charging. The charge signal or pattern collected by the conformable electrode may be displayed in synchronism with the electron beam scan and/or compared in processor 96 with a correct signal or pattern to automatically detect defects.

Figure 3:
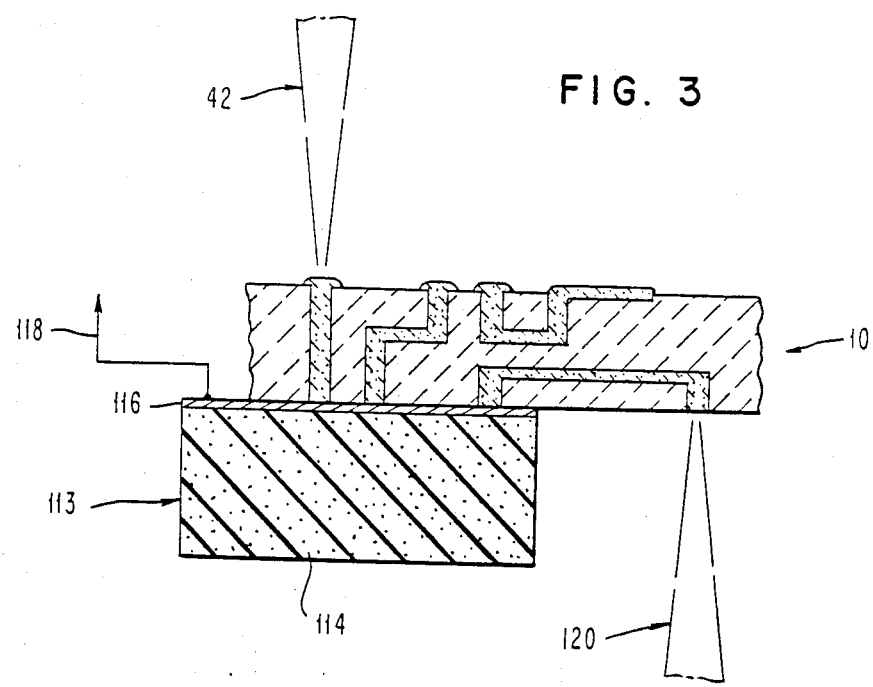
FIG. 3 shows still another kind of conformable electrode and illustrates in phantom an electrical testing variation.

FIG. 3 illustrates still another conformable electrode 113. A soft spongy material 114 supports a conductive film 116 having an electrical connection to line 118, which may either apply or collect charge. Unfired ceramic specimen 10 rests on electrode 113. The spongy material 114 applies a uniformly distributed upward force on film 116 in opposition to the downward directed force upon specimen 10 (arising for example by virtue of the action of gravity), thereby conforming film 116 to the bottom surface of specimen 10 and in electrical contact therewith. FIG. 3 further illustrates in phantom an electron beam 120 either applying charge or sensing the charge state of paste filled pathways which have a remote end at another portion of the same surface to which conforming contact is being made with an electrode. It should be apparent that two electron beams could be used simultaneously as well as more than one discrete conformable electrode depending upon the type and nature and complexity of the electrical test desired. Particular details of the electrical test method or mode of operation which is used in connection with the conformable electrode do not form part of this invention. Detailed descriptions of such methods and modes of operation may be found in the cited copending applications and in the prior art references identified therein.

Figure 4:
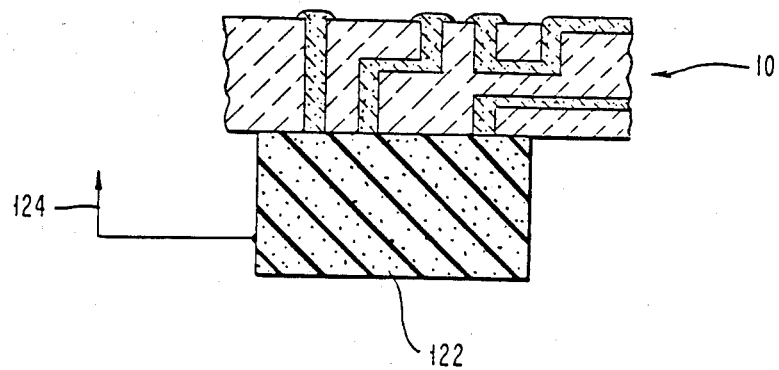
FIG. 4 shows yet another kind of conformable electrode.

FIG. 4 illustrates a further conformable electrode embodiment. In this embodiment, the conformable electrode comprises a block or plate electrically conducting elastomer 122 to which electrical contact via line 124 is made.

Many modifications and variations of our invention will be apparent to those of ordinary skill in this art and may be made without departing from the spirit and scope of our invention as defined by the following claims. For example, obviously any of the described conformable electrodes could be used either as a charge applying electrode or as a charge collecting electrode and any of the conformable electrodes could be used with either greensheets or laminated assemblies or subassemblies of greensheets.

Having thus described our invention, what we claim as new, and desire to secure by Letters Patent is:

1. A method of testing the physical continuity of metallic paste within unsintered ceramic structures having non-planar surface topography and containing exposed metallic paste lines and vias, comprising the steps of:

temporarily contacting a surface region of an unsintered ceramic structure containing metallic paste lines and vias with a detachable electrode which conforms to topographical contours in the contacted surface, said contacted surface region having many exposed metallic paste regions and a non-planar surface topography;

said electrode contacting all of said exposed paste regions underlying said electrode without damaging any contacted paste lines or vias, scanning a different surface are of said ceramic structure with an electron beam, said different surface area being separate from said surface area contacting said electrode;

said different surface area having exposed paste regions, at least some of which have physical continuity with paste regions contacting said electrode; and sensing current collected by said electrode as said electron beam scans said different surface area, whereby paste continuity between each of said exposed paste regions at said different surface area and said eletrode thereby is individually tested by sensing the current collected by said electrode when each of said exposed paste regions at said different surface area is irradiated by said electron beam.

2. The method of claim 1 wherein said temporarily contacted surface region is at least a portion of the bottom surface of said ceramic structure and said different surface area is at least a portion of the top surface of said ceramic structure.

3. The method of claim 1 wherein said temporarily contacted surface region is a portion of the top surface of said ceramic structure and said different surface region is a different portion of the top surface of said ceramic structure.

* * * * *